… … …

United States Patent [19]

Esser et al.

[11] Patent Number: 5,497,828
[45] Date of Patent: Mar. 12, 1996

[54] SOLID CONDUCTOR THERMAL FEEDTHROUGH

[75] Inventors: Keith A. Esser, San Diego; Scott W. Riley, Oceanside; Laurence Warden, San Diego, all of Calif.

[73] Assignee: Biomagnetic Technologies, Inc., San Diego, Calif.

[21] Appl. No.: 486,516

[22] Filed: Jun. 7, 1995

Related U.S. Application Data

[62] Division of Ser. No. 80,743, Jun. 21, 1993, Pat. No. 5,441,107.

[51] Int. Cl.$^6$ .............................. F28F 7/00; F25B 19/00
[52] U.S. Cl. ........................ 165/185; 62/51.1; 156/256
[58] Field of Search ............................ 165/185; 62/51.1, 62/259.2, DIG. 10, 298, 383; 156/256

[56] References Cited

U.S. PATENT DOCUMENTS

| | | | |
|---|---|---|---|
| 2,109,656 | 3/1938 | Thompson et al. . | |
| 2,395,757 | 2/1946 | Peters . | |
| 2,487,851 | 11/1949 | Charland . | |
| 2,707,870 | 5/1955 | Edmondson . | |
| 2,780,757 | 2/1957 | Thornhill et al. | 165/185 |
| 3,023,293 | 2/1962 | Cornish, Jr. . | |
| 3,271,966 | 9/1966 | Webb . | |
| 3,483,709 | 12/1969 | Baicker et al. | 62/383 |
| 3,611,746 | 10/1971 | Marsing et al. | 62/51.1 |
| 4,279,241 | 7/1981 | Himes . | |
| 4,601,040 | 7/1986 | Andrews et al. | 62/383 X |
| 4,827,217 | 5/1989 | Paulson . | |
| 4,833,330 | 5/1989 | Swann et al. | 62/51.1 X |
| 4,856,297 | 8/1989 | Yasue . | |
| 4,931,650 | 6/1990 | Lowe et al. | 62/51.1 X |
| 4,951,674 | 8/1990 | Zanakis et al. . | |
| 4,996,479 | 2/1991 | Hoenig . | |
| 5,193,348 | 3/1993 | Schnapper . | |
| 5,222,366 | 6/1993 | Herd et al. | 62/51.1 |
| 5,248,365 | 9/1993 | Kamioka et al. | 156/256 |

FOREIGN PATENT DOCUMENTS

| | | |
|---|---|---|
| 1585049 | 1/1970 | France . |
| 597902 | 3/1978 | U.S.S.R. . |
| 1592679 | 9/1990 | U.S.S.R. . |
| 27732 | of 1909 | United Kingdom . |

*Primary Examiner*—Leonard R. Leo
*Attorney, Agent, or Firm*—Gregory Garmong

[57] ABSTRACT

A thermally conductive feedthrough has a conductive member extending through a fiber-reinforced plastic plate. The feedthrough is sealed against leakage from one side of the plate to the other by placing the plate in local compression to seal it against the plate and/or by using small individual conductive members that minimize the effects of thermal expansion differences. The feedthrough can be used between vacuum and cryogenic liquids.

7 Claims, 3 Drawing Sheets

SOLID CONDUCTOR THERMAL FEEDTHROUGH

This is a division, of application Ser. No. 08/080,743, filed Jun. 21, 1993, now U.S. Pat. No. 5,441,107.

BACKGROUND OF THE INVENTION

This invention relates to a feedthrough across a solid wall, and, more particularly, to a thermal feedthrough for a solid conductor.

A feedthrough is a structure that permits the selective transmission of a flow of energy or mass through a solid wall. Various types of devices must operate in isolation from temperatures and particular environments. Such devices are normally placed within a sealed enclosure for their operation. However, it often is necessary to selectively transfer some types of energy or mass across the walls of the enclosure, at the same time that the walls prevent the transmission of other types of energy or mass.

As an example, some types of electronic devices must be operated at very low, cryogenic temperatures in a vacuum. The devices are placed into a sealed, insulated enclosure that insulates against a heat flow into the enclosure and thence to the devices. The interior of the insulated enclosure is evacuated by a vacuum pump either continuously, or initially and then sealed. With such an insulated enclosure, it is usually necessary to provide for two types of feedthroughs in the wall of the insulated enclosure. One is an electrical signal feedthrough, so that electronic signals and sometimes power can be transmitted into and out of the enclosure. Various types of electrical feedthroughs are well known in the art.

The other type of feedthrough is a thermal feedthrough. A thermal feedthrough permits a flow of heat to be removed from within the evacuated space interior to the insulated enclosure to an exterior cooling device, to keep the devices within the insulated enclosure cooled to their operating temperatures. In one possible type of thermal feedthrough, a solid conductor extends from the interior of the insulated enclosure to the exterior, and must pass through the wall of the enclosure.

Such solid conductor thermal feedthroughs are more difficult to construct than electrical feedthroughs, particularly if a vacuum seal must be maintained across the wall and the feedthrough. The problem arises from the fact that the various components of the wall and the feedthrough structures generally have different thermal expansion coefficients. The solid conductor is a metal of high thermal conductivity such as copper, aluminum, or silver. The wall is typically a nonmetallic structure such as fiberglass-reinforced plastic composite material, or a metal structure of low thermal conductivity.

When the interior of the insulated enclosure is cooled, the various components contract at different rates. The components tend to separate from each other as a result of the differing contractions, resulting in vacuum leaks across the feedthrough. The problem aggravated if the insulated enclosure and the feedthrough are repeatedly cooled and heated, as often occurs during cycles of operation, because some portions of the damage induced by the thermal expansion differences can accumulate with increasing numbers of cycles. The result is an accumulation of thermal fatigue damage to the structure and its eventual failure.

There is a need for an improved approach to solid conductor thermal feedthroughs, which permit efficient heat flow but are resistant to damage such as vacuum leaks induced by single or multiple thermal excursions. The present invention fulfills this need, and further provides related advantages.

SUMMARY OF THE INVENTION

The present invention provides a thermal feedthrough across a wall for a solid thermal conductor. Heat from one side of the wall is conducted to the other side of the wall via the solid conductor. The thermal feedthrough allows this heat to be transferred across the wall, and also retains a vacuum-tight hermetic seal at the wall. The vacuum-tight seal is maintained during and after thermal excursions such as the cooling of the interior to a cryogenic temperature, either once or many times during multiple cycles of operation. The feedthrough may be made in a nonmagnetic form, an important attribute for some types of applications.

In accordance with the invention, a thermal feedthrough comprises a fiber-reinforced plastic plate having a first surface and a second surface, and further having a plate bore therethrough, with the plate bore having a first diameter over a first portion of its length and a second, larger diameter over a second portion of its length adjacent to the second surface. The b ore of the plate is filled with a metallic conductive plug having a first diameter over a first portion of its length and a second, larger diameter over a second portion of its length. There is an adhesive seal between the plate and the plug. The first portion of the plate bore is sufficiently large to receive the first portion of the plug therein with an interference fit, and the second portion of the plate bore being sufficiently large to receive the second portion of the plug therein. Upon assembly, the plate is placed in radial compression in the region of the plate bore.

The method of manufacture of this thermal feedthrough contributes significantly to its success by introducing the radial compression into the plate. In accordance with this aspect of the invention, a method of preparing a thermal feedthrough comprises the steps of providing a fiber-reinforced plastic plate having a first surface and a second surface, and further having a plate bore therethrough. The plate bore has a first diameter over a first portion of its length and a second, larger diameter over a second portion of its length adjacent to the second surface. The method further includes providing a metallic conductive plug having a first diameter over a first portion of its length and a second, larger diameter over a second portion of its length. The first portion of the plate bore is sufficiently large to receive the first portion of the plug therein with an interference fit, and the second portion of the plate bore is sufficiently large to receive the second portion of the plug therein with an interference fit. At least one of the plate bore and the plug is coated with an adhesive. The first portion of the plug is forced into the first portion of the plate bore until the second portion of the plug enters the second portion of the plate bore and bottoms. Additional axial pressure is applied to the plug after the plug has bottomed. The axial pressure is sufficiently high to place the region of the plate adjacent the second bore into residual compression.

In another aspect of the invention, a thermal feedthrough comprises a fiber-reinforced plastic plate having a first surface and a second surface, and further having a threaded plate bore therethrough. A threaded bolt made of a metallic alloy with relatively poor thermal conductivity is engaged to the threaded plate bore. The bolt has an interior bolt bore therethrough. A first metallic thermal conductor extends through the interior of the interior bolt bore and is sealed to the internal surface of the bolt bore, as by soldering. A layer of a first adhesive is disposed between the threads of the bolt and the bore of the plate. A first retainer is engaged between the bolt and the plate adjacent to the first surface of the plate, and a second retainer is engaged between the bolt and the plate adjacent to the second surface of the plate. The second retainer includes a volume of a second adhesive contacting the second surface of the plate, and a nut threadably engaged to the bolt. The first retainer, the second retainer, and the bolt cooperate to place the bolt in tension and the plate in compression. A second metallic thermal conductor is affixed to the first metallic conductor at a first end thereof, and a third metallic thermal conductor is affixed to the first metallic conductor at a second end thereof.

In yet another embodiment of the invention, a thermal feedthrough comprises a fiber-reinforced plastic plate having a first surface and a second surface, and further having a plate bore therethrough. A plug is sized to fit within the plate bore and is affixed into the plate bore. The plug comprises a length of a cured fiber-reinforced composite material wound onto a cylindrical nonmetallic form into a generally cylindrical, multiturn, jelly roll coil, with the cylindrical axis of the coil generally perpendicular to the surfaces of the plate. At least one thermally conductive wire penetrates between the turns of the coil and through the length of the cylindrical coil generally parallel to a cylindrical axis of the coil.

The feedthrough of the invention permits thermal energy to be controllably introduced into or removed from one side of an enclosure wall with a solid conductor, while maintaining a hermetic, vacuum-tight seal at the wall. The seal is maintained during thermal excursions on one or both sides of the wall, to cryogenic temperatures. The feedthrough may be made entirely of nonmagnetic materials, so that it does not adversely affect magnetic measurements made in the vicinity of the feedthrough. Other features and advantages of the present invention will be apparent from the following more detailed description of the preferred embodiment, taken in conjunction with the accompanying drawings, which illustrate, by way of example, the principles of the invention.

DETAILED DESCRIPTION OF THE INVENTION

Figure 1:
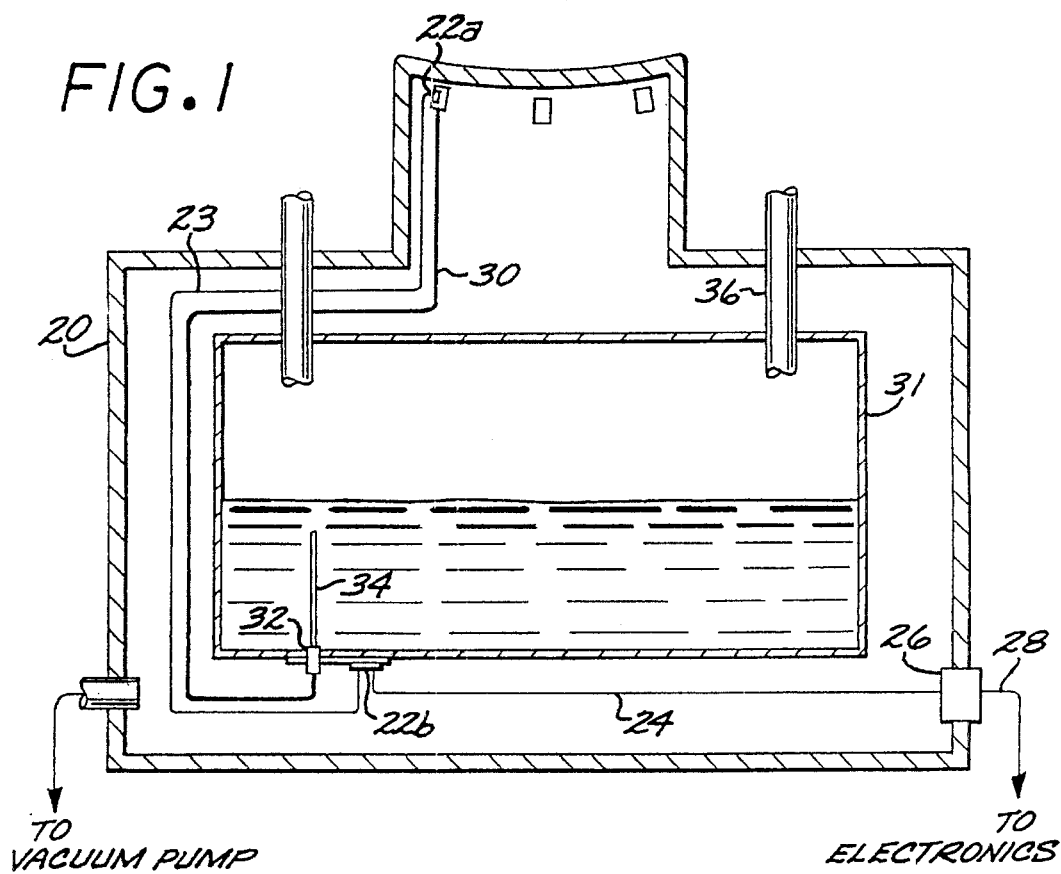
FIG. 1 is a side sectional view of a structure utilizing a solid thermal conductor and a conductor feedthrough.

FIG. 1 depicts a typical situation where the feedthrough of the present invention can be used, although the use of the present invention is not so limited. FIG. 1 illustrates an insulated enclosure 20. The inside of the insulated enclosure 20 is evacuated, so that a one-atmosphere pressure differential exists across the walls of the insulated enclosure 20. A sensor 22, having a pickup coil 22a and a detector 22b connected by an electrical lead 23, is positioned in the interior of the insulated enclosure 20. An internal electrical lead 24 extends from the detector 22b to an electrical feedthrough 26 of conventional design, placed in the wall of the insulated enclosure 20. Electrical feedthroughs 26 are available commercially from suppliers such as Amphenol or Cannon. An external electrical lead 28 extends from the electrical feedthrough 26 to external electronics, not shown.

Separately, an internal solid thermal conductor 30 extends from the sensor 22 to a reservoir 31 located within the vacuum enclosure 20. There is a thermal feedthrough 32 through the wall of the reservoir 31, and a extension solid thermal conductor 34 of the thermal conductor 30 within the interior of the reservoir 31. The reservoir 31 contains a supply of a cryogenic liquid. The reservoir is supported from the wall of the insulated enclosure 20 by hollow tubes 36, which vent the interior of the reservoir 31 and also act as fill tubes for adding the cryogenic liquid to the reservoir. The structure of the thermal feedthrough 32 is the subject of the present invention, and will be discussed in greater detail subsequently. The solid thermal conductors 30 and 34 may be formed of single metallic conductor or multiple metallic conductor elements such as braided wires. Substantially pure copper, copper alloys, substantially pure aluminum, aluminum alloys, substantially pure silver, silver alloys, substantially pure gold, and gold alloys are the preferred materials of construction of the thermal conductors 30 and 34.

Figure 2A:
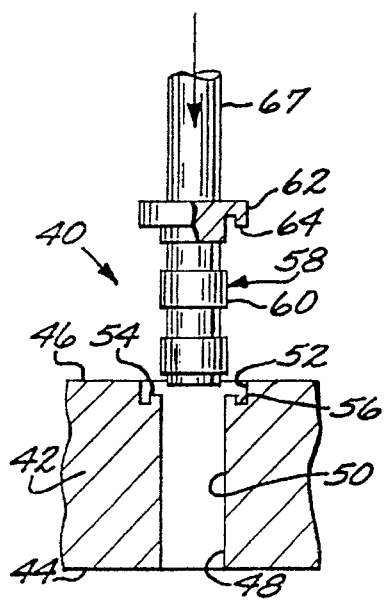
FIG. 2 is a side sectional view of a first embodiment of the feedthrough of the invention at various stages of its assembly, showing in FIG. 2(a) the components prior to assembly, in FIG. 2(b) the partially assembled feedthrough, and in FIG. 2(c) the completed feedthrough.
Figure 2B:
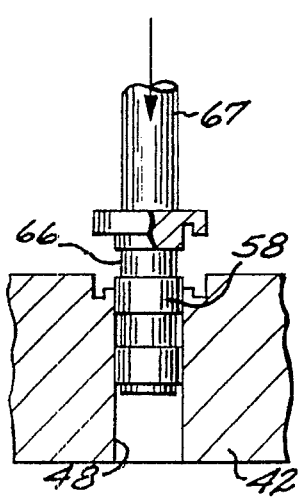
Figure 2C:
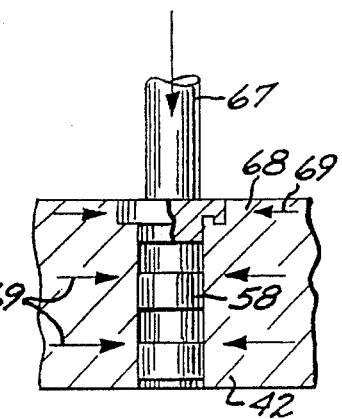
Figure 3:
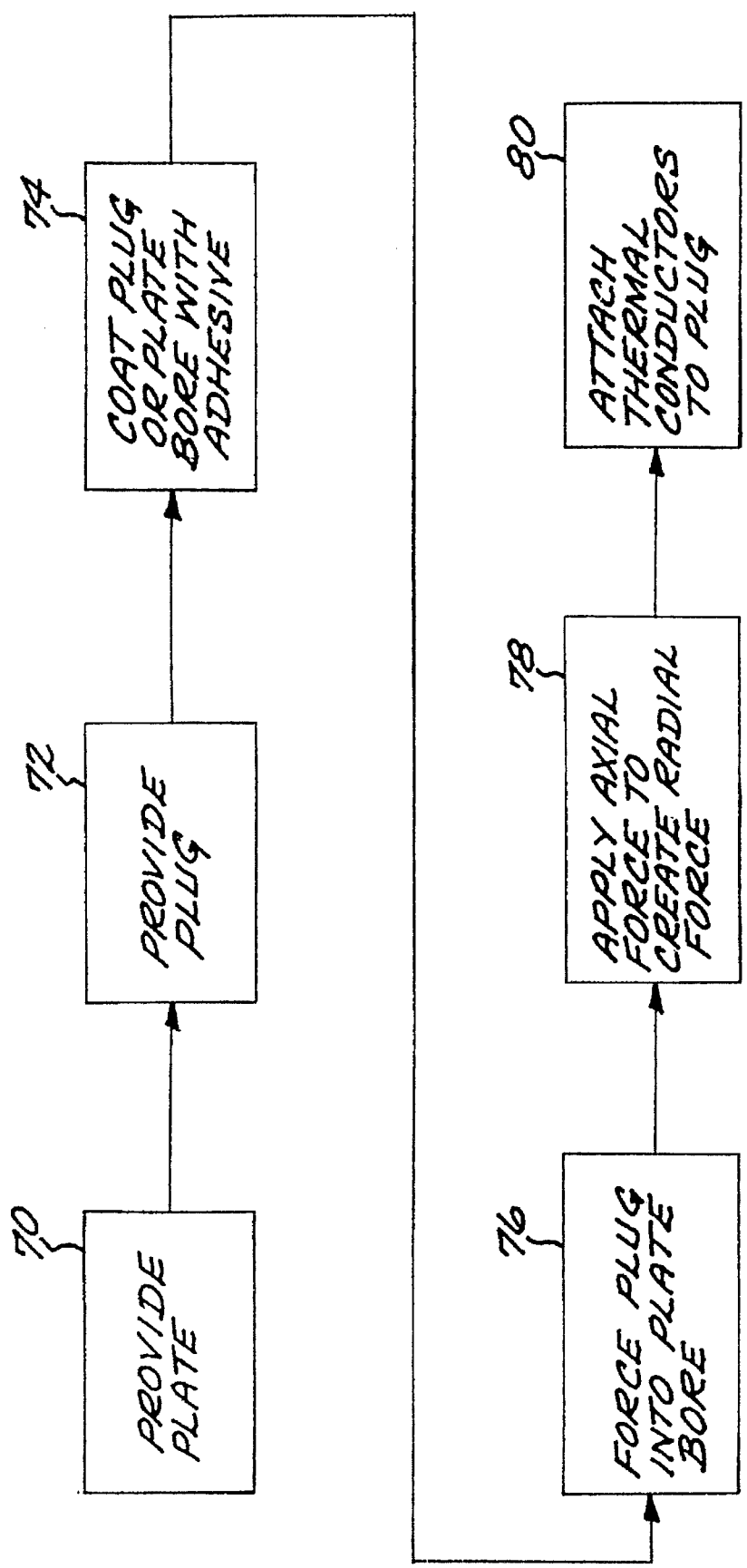
FIG. 3 is a process flow diagram for a method of preparing the first embodiment of the feedthrough.

FIG. 2 depicts a first embodiment of the feedthrough of the invention, and FIG. 3 illustrates the assembly of the feedthrough. Referring in particular to FIG. 2(a), a feedthrough 40 includes a plate 42, which may be made of a nonmagnetic material, and preferably of a fiber-reinforced plastic material such as fiberglass. The plate 42 has a first surface 44 and a second surface 46. The size of the plate 42 is not critical, provided that the plate has sufficient strength that it does not deform significantly under the one-atmosphere pressure differential. By way of illustration and not of limitation, a preferred plate 42 is about 4 centimeters thick and about 43 centimeters in diameter.

A cylindrically symmetric bore 48 extends through the thickness of the plate 42 from the first surface 44 to the second surface 46. The bore 48 has two portions along its length, a first portion 50 adjacent to the first surface 44 and a second portion 52 adjacent to the second surface 46. The first portion 50 has a first diameter and the second portion 52 has a second, larger diameter. A shoulder 54 lies between the first portion 50 and the second portion 52.

In a preferred embodiment, a reentrant recess 56 is positioned around the diameter of the second portion 52 of the bore, at a location where the second portion 52 contacts the shoulder 54. The recess 56 is in the form of a toroidal cutout portion or notch extending from the diameter of the second portion 52 to a diameter somewhat greater than the diameter of the first portion 50. By way of illustration and not limitation, in a preferred embodiment, the first portion 50 has a length of 2.84 centimeters and a diameter of 0.95 centimeters, and the second portion 52 has a length of 0.47 centimeters and a diameter of 1.58 centimeters. The recess 56 has a length of 0.15 centimeters.

A cylindrically symmetric plug 58 is sized to fit within the bore 48 of the plate 42. The plug is preferably made of substantially pure copper, a copper alloy, substantially pure aluminum, an aluminum alloy, substantially pure silver, a silver alloy, substantially pure gold, or a gold alloy. These metals all have acceptable thermal conductivity, with the pure metals being preferred and pure copper being most preferred.

The plug 58 has a first portion 60 with a maximum diameter sized to achieve an interference fit with the first portion 50 of the bore of the plate 42. The first portion 60 of the plug 58 may have a smooth outer diameter, or may have a stepped outer diameter, as shown. The stepped outer diameter configuration is preferred, as it aids in achieving a good seal of the plug 58 to the plate 42 and also eases the assembly operation. The plug 58 has a second portion 62 sized to achieve a slip fit with the second portion 52 of the bore of the plate 42. The interference fit is typically achieved by sizing the outer diameter of the first portion 60 of the plug 58 to be about 0.05 millimeters larger than the inner diameter of the respective portion of the plate 42, within available machining tolerances. Even though the plug is of slightly larger diameter than the bore, the assembly is achieved by force fitting the plug into the bore because the plug is made of a slightly compliant material.

The second portion 62 of the plug 58 has a lip 64 extending therefrom parallel to the cylindrical axis of the plug 58. The lip 64 is configured and sized to fit within the reentrant recess 56 of the second portion 52 of the bore 48 of the plate 42, with a gap of about 0.05 millimeters to allow excess adhesive to be expelled during assembly.

FIGS. 2(b) and 2(c) show the physical relationships of the components during the stages of assembly. Referring to FIGS. 2(b) and 3, to assemble the feedthrough 40, the plate 42 is provided, numeral 70, and the plug 58 is provided, numeral 72. Immediately before assembly, the first and second portions of the bore 48, and/or the first and second portions of the plug 58 are coated with an adhesive 66, numeral 74. The adhesive 66 is preferably a curable adhesive such as an epoxy. An acceptable epoxy is a polyurethane adhesive such as Model 810, made by Crest. This epoxy cures at ambient temperature in a time of about 4 days after application, permitting the mechanical assembly to be completed before the epoxy hardens. The plug 58 is inserted into the bore 48 and forced downwardly against the interference fit using a tool 67 that fits against the end of the plug 58, numeral 76.

At full insertion, the plug 58 bottoms against the shoulder 54 and the lip 64 engages the reentrant recess 56. At this point, the compressive force on the tool 67 is increased to at least about 6000 pounds for at least about 30 seconds, numeral 78. This compressive force on the tool 67 causes the material in area 62 of plug 58 to flow radially outwardly into the plate 42, in a region 68 adjacent to the first portion 52 of the bore 48. The compressive force is great enough that a 0.25–0.38 millimeter impression is left in the plug after the compression tool is removed. A residual radially inwardly directed compressive force remains in the region 68, as indicated by the arrows 69 in FIG. 2(c).

Finally, the thermal conductors 30 and 34 are affixed to the opposite ends of the plug 58, numeral 80. The preferred approach to attaching the thermal conductors 30 and 32 is clamped connections using screws or bolts. Alternatively, the conductors can be hard soldered prior to assembly, as long as they are configured so that there is room to use the tool 67.

In the most demanding type of application, a vacuum is drawn on one side of the plate 42 (e.g., the interior of the insulated enclosure 20 of FIG. 1), and the other side of the plate 42 is at atmospheric pressure (e.g., the interior of the reservoir 31). The close fit between the plug 58 and the bore 48 of the plate 42, the presence of the epoxy adhesive 66, and the radially inward compressive force 69 all cooperate to establish a vacuum-tight, hermetic seal so that gas cannot leak through the feedthrough 40 from the external environment into the interior of the vessel. In service, the external thermal conductor 34 is cooled to cryogenic temperature by contact with a heat sink. Heat flows from the sensor 22 along the internal thermal conductor 30, through the plug 58, along the external thermal conductor 34, and to the heat sink. The plug 58 and the adjacent portions of the plate 42 are cooled to cryogenic temperatures. The metallic plug 58 has a smaller thermal expansion coefficient than the fiber-reinforced plastic plate 42. In the cooling process, the plug 58 has a natural tendency to contract radially less than the plate 42 at the bore 48. It is important to cool the assembly of plug and plate slowly to prevent the plug from pulling away from the plate. The epoxy adhesive has some compliance and so continues to act as a sealant between the plug and the plate, opposing the tendency for a leak path to open between the plug 58 and the bore 48, so that there is a tendency for a leak path to open between the plug 58 and the bore 48. The epoxy adhesive has some compliancy to prevent such a leak. The radial relaxation of the residual compressive force 69 in the plate 42 also serves to maintain the bore 48 in close contact with the plug 58, also resisting the tendency to form a leak path.

Ten feedthroughs 40 were prepared in a single plate by the approach just described. The plate and feedthroughs were cycled between ambient temperature and a temperature of 4K for a total of 12 cycles to test the structure. There were no failures.

Figure 4:
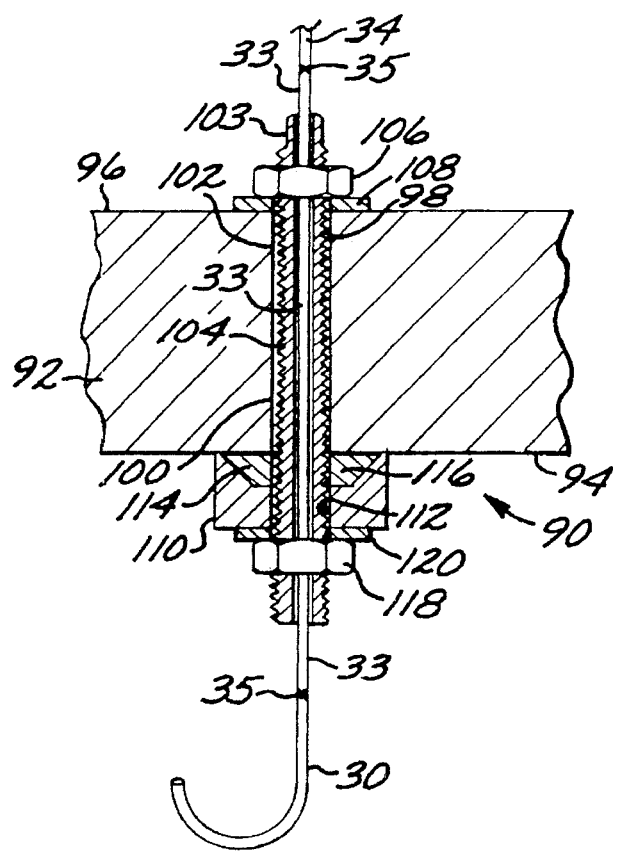
FIG. 4 is a side sectional view of a second embodiment of the feedthrough of the invention.

A second embodiment of the feedthrough is shown in FIG. 4. A feedthrough 90 includes a fiber-reinforced plastic plate 92, which is preferably of the same material as the plate 42 described previously. The plate has a first surface 94 and a second surface 96. The plate 92 has a bore 98 therethrough extending between the surfaces 94 and 96. The bore 98 is of substantially constant diameter and is internally threaded.

A bolt 100 is externally threaded with threads to engage the threads of the bore 98. The bolt 100 is made of a metallic material such as a copper-beryllium alloy, most preferably an alloy of copper and about 2 weight percent beryllium. This alloy has a lower thermal conductivity than pure copper, but has higher strength. The higher strength is beneficial in sustaining the axial mechanical loadings present in the bolt 100 that are not imposed upon the plug 58 in the embodiment of FIG. 2.

The bolt 100 is of sufficient length to extend between the surfaces 94 and 96, and a short distance beyond on each side. The bolt 100 has an interior bolt bore 102 of a first diameter extending through the interior of the bolt 100, of sufficient length to extend along most of the length of the bolt 100, and a second bore 103 of a small diameter than the first diameter extending along the balance of the length of the bolt 103. The bolt bores 102 and 103 reduce the effective radial and longitudinal thermal expansion forces of the bolt 100 when the feedthrough 90 is cooled during service, aiding in the avoidance of a leak path through the feedthrough 90. A metallic conductor 33 of high thermal conductivity is sealed into the bolt at the bolt bore 103, preferably by hard soldering.

An adhesive layer 104 is present between the bolt 100 and the plate bore 98. The adhesive is preferably the same type of epoxy used as the adhesive 66.

A first retainer, preferably a nut 106, is threaded to the end of the bolt 100 extending out the plate 92 from its second surface 96. A nylon washer 108 is preferably placed between the nut 106 and the second surface 95 to seal the adhesive during assembly.

A dam 110 made of a compliant material such as polytetrafluoroethylene (also known as teflon) is placed against the first surface 94. The dam 110 has an axial bore 112 that receives the bolt 100 therethrough. The dam 110 further has an internal cavity 114 that is filled with a flowable adhesive 116 during assembly. The flowable adhesive 116 is preferably the same material as the adhesive 104 and the adhesive 66. The dam 110 seals against the first surface 94 of the plate 92 and against the bolt 100.

A second retainer, preferably a nut 118, is threaded to the end of the bolt 100 extending out of the plate 92 from the first surface 94 and out of the dam 110. A nylon washer 120 is preferably placed between the nut 118 and the surface of the dam 110.

One of the metallic thermal conductors 30 is affixed to one end of the conductor 33, and the other of the metallic thermal conductors 34 is affixed to the other end of the conductor 33. The conductors are preferably affixed by hard soldering, such as silver soldering at joints 35, preferably before the feedthrough is assembled to the plate.

When the feedthrough 90 is assembled, the threads of the bolt 100 and/or the interior of the plate bore 98 are coated with the flowable, as-yet-uncured epoxy adhesive 104. The bolt 100 is threaded into the plate bore 98, the washer 108 is placed over the end of the bolt 100, and the nut 106 is threaded onto the bolt 100. At the other end, the cavity 114 of the dam 110 is filled with the flowable epoxy adhesive 116 and the dam 110 is placed over the end of the bolt 100. The washer 120 is placed over the end of the bolt 100, and the nut 118 is threaded onto the bolt 100.

The nut 106 is tightened slightly to seal the dam 110 to the first surface 94 and to the end of the bolt 100. The nut 106 is further tightened, and the nut 118 may also be tightened. The tightening of the nuts forces flowable epoxy adhesive 116 from the cavity 114 into any remaining space between the threads of the bolt 100 and the threaded plate bore 98. The state of compression is maintained during the curing of the epoxy adhesive. The dam 110 compresses and deforms. As a result of this process, any air pockets in the epoxy adhesive are either removed or compressed substantially during curing. The result is a vacuum-tight, hermetic seal so that gas cannot leak from one side of the plate 92 to the other during service, even after cooling and heating of the feedthrough 90.

The thermal conductors 30 and 34 are preferably attached to the ends of the bolt 100 before assembly. In the preferred approach, the conductors 30 and 34 are affixed before assembly by silver soldering.

The feedthrough 90 has been constructed in the manner discussed and tested. Two such feedthroughs were cycled 20 times between ambient temperature and 4K without failure.

The embodiments of FIGS. 2 and 4 are most suited to the situation wherein the thermal conductors 30, 33, and 34 are single metallic pieces. In another construction, the conductors 30 and 34 may be formed as an array of braided or bundled smaller strands. For example, in the one approach the conductors 30 and 34 can be single metallic pieces of a diameter 0.25 centimeters. In the other approach, the conductors 30 and 34 can be about 1–100, preferably about 20, metallic strands each of a diameter of 0.3 millimeters.

Figure 5:
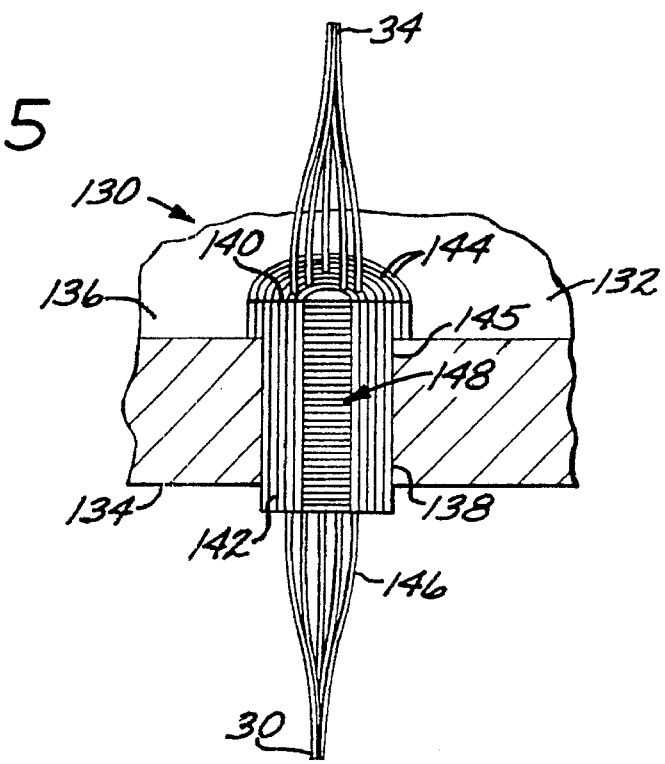
FIG. 5 is a schematic combined side sectional and perspective view of a third embodiment of the feedthrough of the invention.

The embodiment of FIG. 5 is particularly useful for the case where the thermal conductors 30 and 34 are formed as a number of individual conductors, either bundled or braided. The smaller size of the individual wires lessens the effects of strain caused by differential thermal contraction upon cooling to cryogenic temperature. A feedthrough 130 includes a fiber-reinforced plastic plate 132, preferably made of the same material as the plates 42 and 92. The plate 132 has a first surface 134 and a second surface 136. A bore 138 extends through the plate 132 from the first surface 134 to the second surface 136.

A plug 140 is formed as a roll 142 of individual turns 144 of a cured and hardened prepreg material. The plug is formed and then machined as necessary to fit within the bore 138 of the plate 132, and affixed within the bore 138 with an adhesive 145. The continuous thermal conductor 30, 34 is made of a plurality of individual strands 146. The individual metallic strands 146 are interleafed between the turns 144 of the roll 142. Since the individual strands 146 are quite small in size, the difference in absolute dimensional changes induced by thermal expansion differences between the plate and the plug is quite small. The cured and hardened prepreg material has some inherent compliancy that can accommodate this small absolute dimensional change. Stated alternatively, the thermal expansion dimensional changes which can otherwise lead to leaks through the feedthrough after temperature changes during service are spatially diffused sufficiently that the structure accommodates the changes and no leaks occur.

The plug 140 is manufactured by placing a strip of partially cured (i.e., B-stage cured) fiberglass prepreg material onto a surface. The prepreg material is soft and can be formed in this state. A cylindrical form 148 is placed at one end, and the strands 146 are placed at positions along the length of the strip crossing the strip. The strip is rolled onto the form 148 in a jelly-roll fashion, capturing the strands 146 between the various turns 144 of the roll 142 as it forms. As the rolling proceeds, all of the strands 146 are captured between the turns 144 of the roll 142.

The B-staged material of the roll 142 is cured in the normal fashion. The curing usually involves placing the roll 142 (including the captured strands 146 and the form 148) into an autoclave or a pressure bag within a furnace. As the curing proceeds, the pressure on the roll forces the strands 146 of metal to be pressed into the curing prepreg material. The fibers of the prepreg material tend to surround and support the metal strands 146 in the final product. The close contact of the prepreg material and the strands ensures an absence of a leak path, and the previously mentioned spatial diffusion of the thermal expansion displacements avoids the development of leaks during subsequent temperature excursions during service.

After the plug 140 is cured, it is machined as necessary along its outside dimensions to fit within the plate bore 138 as shown. The plug 140 is placed within the bore 138 and fixed into place with an adhesive such as an ambient-temperature curable epoxy. The seal between the plug 140 and the plate 132 is accomplished by standard techniques, because the thermal expansion of the cured epoxy of the plug 140 and the fiber-reinforced plastic of the plate 132 are comparable.

The structure of the feedthrough 130 has been constructed. Two samples were tested by cycling it 20 times between ambient temperature and 4K. There was no failure of the feedthrough.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A thermal feedthrough, comprising:

a fiber-reinforced plastic plate having a first surface and a second surface, and further having a threaded plate bore therethrough;

a threaded bolt made of a metallic alloy and engaged to the threaded plate bore, the bolt having an interior bolt bore therethrough;

a first metallic thermal conductor extending through the interior bolt bore and sealed thereto;

a layer of a first adhesive between the threads of the bolt and the bore of the plate;

a first retainer engaged between the bolt and the: plate adjacent to the, first surface of the plate;

a second retainer engaged between the bolt and the plate adjacent to the second surface of the plate, the second retainer including
  a volume of a second adhesive contacting the second surface of the plate, and
  a nut threadably engaged to the bolt; the first retainer, the second retainer, and the bolt cooperating to place the bolt in tension and the plate in compression;

a second metallic thermal conductor affixed to the first metallic conductor at a first end thereof; and a third metallic thermal conductor affixed to the first metallic conductor at a second end thereof.

2. The feedthrough of claim 1, wherein the first adhesive and the second adhesive are selected from the group consisting of an epoxy and a polyurethane adhesive.

3. The feedthrough of claim 1, wherein the plate is comprised of glass fibers incorporated into a curable polymeric matrix.

4. The feedthrough of claim 1, wherein the first metallic conductor is made of a material selected from the group consisting of copper, a copper alloy, aluminum, an aluminum alloy, silver, a silver alloy, gold, and a gold alloy.

5. The feedthrough of claim 1, wherein at least one of the second metallic thermal conductor and the third metallic thermal conductor is affixed to the first metallic conductor by soldering.

6. The feedthrough of claim 1, wherein the bolt is made of a copper-beryllium alloy.

7. The feedthrough of claim 1, wherein the feedthrough is made entirely of nonmagnetic materials of constructions.

* * * * *